(12) United States Patent
Chan et al.

(10) Patent No.: US 7,369,446 B2
(45) Date of Patent: May 6, 2008

(54) METHOD AND APPARATUS TO PREVENT HIGH VOLTAGE SUPPLY DEGRADATION FOR HIGH-VOLTAGE LATCHES OF A NON-VOLATILE MEMORY

(75) Inventors: Johnny Chan, Fremont, CA (US); Jinshu Son, Saratoga, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/457,377

(22) Filed: Jul. 13, 2006

(65) Prior Publication Data

US 2008/0056015 A1   Mar. 6, 2008

(51) Int. Cl.
*G11C 7/00* (2006.01)

(52) U.S. Cl. .......................... 365/189.05; 365/189.01; 365/189.09

(58) Field of Classification Search ........... 365/189.05, 365/189.01, 189.09
See application file for complete search history.

(56) References Cited

U.S. PATENT DOCUMENTS

| | | | |
|---|---|---|---|
| 5,963,054 A | 10/1999 | Cochran et al. | |
| 6,157,577 A | 12/2000 | McPartland | |
| 6,414,518 B1 | 7/2002 | Patel et al. | |
| 6,768,682 B2 | 7/2004 | Yano et al. | |
| 6,903,977 B2 | 6/2005 | Fujiwara et al. | |
| 6,972,234 B1 | 12/2005 | Madurawe et al. | |
| 7,209,403 B2 * | 4/2007 | Santin | 365/225.7 |
| 7,224,624 B2 * | 5/2007 | Lee et al. | 365/189.05 |

* cited by examiner

*Primary Examiner*—Pho M. Luu
(74) *Attorney, Agent, or Firm*—Schneck & Schneck; Thomas Schneck

(57) ABSTRACT

An improved cross-coupled CMOS high-voltage latch that is used for storing data bits to be written to memory cells of a non-volatile memory is provided with a switching circuit that, during writing of data bits into the memory cells of the latch, provides a high series impedance between one leg of the latch and ground to limit leakage current. A large number of latches are connected in parallel and their accumulated leakage currents are limited by the switching circuit to prevent overload of a high-voltage generator, such as a charge pump circuit, for the high-voltage latch, so that data can be properly written in the memory cells of the non-volatile memory.

21 Claims, 6 Drawing Sheets

Fig._3

US 7,369,446 B2

METHOD AND APPARATUS TO PREVENT HIGH VOLTAGE SUPPLY DEGRADATION FOR HIGH-VOLTAGE LATCHES OF A NON-VOLATILE MEMORY

TECHNICAL FIELD

The present invention relates to high-voltage data latches that are used writing data into a non-volatile memory and, more particularly, to apparatus and a method for limiting leakage current drawn from a high voltage supply or generator, such as an on-chip charge pump circuit.

BACKGROUND ART

A latch is used to store data bits to be written into pre-selected memory cells of a non-volatile memory. Except when data bits are being written into the memory cells, the latch is normally supplied with a low-voltage power supply, such as, for example, 3 volts or less. During a write mode of operation, the latch is supplied with a high voltage of 7-15 volts, as required for writing data into the non-volatile memory cells. A single non-volatile memory chip may contain a large number, for example, 512 or more high-voltage latch circuits. These latch circuits are typically called high-voltage latch circuits, although a high voltage supply is only required for write operations. An on-chip high-voltage supply or generator, such as a charge pump circuit, provides the high-voltage for writing the data bits into the memory cells. The high-voltage generator typically has limited current capability and excessive leakage currents in the some of the high-voltage latches may load down the generator so much as to cause the high-voltage level to be less than what is required for proper writing of data bits into the memory cells of the non-volatile memory.

FIG. 1 illustrates a typical cross-coupled high-voltage latch circuit 10 that includes a first CMOS inverter circuit 12 and a second CMOS inverter circuit 14. The first CMOS inverter circuit 12 includes a first pull-up PMOS transistor 16 that has a drain connected to a HV node 18 and a source connected to a latch input node A. The first CMOS inverter circuit 12 also includes a first pull-down NMOS transistor 20 that has a drain connected to the latch input node A and a source connected to ground. The gates of the first pull-up PMOS transistor 16 and the pull-down NMOS transistor 20 are connected together. Note that the HV node 18 is supplied with low voltage except when a write mode of operation occurs.

The second CMOS inverter circuit 14 includes a second pull-up PMOS transistor 22 that has a drain connected to the HV node 18 and a source connected to a data storage output node B. The second CMOS inverter circuit 14 also includes a second pull-down NMOS transistor 24 that has a drain connected to the data storage output terminal B and a source connected to ground. The gates of the second pull-up PMOS transistor 22 and the second pull-down NMOS transistor 24 are connected together.

To enable operation of the high-voltage latch circuit 10 with a normal low VDD voltage being supplied at the HV node 18, the second pull-down NMOS transistor 24 is a low-threshold voltage Vt, high-voltage NMOS transistor, which tends to have a high leakage current at high write voltages because of its susceptibility to punch through at high voltages. Thus, a leakage path is provided from the HV node 18 to ground through a leaky second pull-down NMOS transistor 24 with a low threshold voltage, Vt.

The latch input node A is connected through a load input NMOS transistor 26 to a DATA In terminal 28. A LOAD signal is provided at a gate terminal 30 of the load input NMOS transistor 26 to load a data bit at the DATA IN terminal 28 into the latch input node A.

When the non-volatile chip is not being used in a high-voltage write mode of operation, a Vdd logic-circuit power supply voltage of 3 volts, for example, is provided to the HV node 18 to power the two inverters 12, 14 forming the high-voltage latch 10. When the non-volatile chip is actually being used in a high-voltage write mode of operation, a suitable high-voltage power supply of, for example, 7-15 volts is provided to the HV node 18 to power the two inverters 12, 14 forming the high-voltage latch. The high-voltage is supplied from a high-voltage generation circuit, such as, for example, a charge-pump circuit that is provided on the chip.

In order to provide for proper switching operation of the latch with a low Vdd logic-circuit supply voltage, such as, for example, 3 volts or less, the NMOS transistor 24 is a high-voltage, low Vt devices. The NMOS transistor 24 needs to be a low threshold device because loading a HIGH, or "1", signal to the latch input node A is difficult due to the Vt voltage drop across the load input NMOS transistor 26.

When the chip is in a high-voltage write mode of operation with the HV terminal at 7-15 volts and when the data storage output node B is at a "1" logic level, the high-voltage pull-up PMOS transistor 22 is turned on and the high-voltage pull-down, low-threshold voltage NMOS transistor 24 is turned off. This essentially places almost all of the 7-15 volts from the HV terminal 18 across the low-threshold NMOS transistor. If the high-voltage pull-down NMOS transistor 24 is leaky because of the presence of a punch through path in it, a leakage path goes from the high voltage at the data storage output node B to ground through the leaky pull-down low-threshold NMOS transistor 24.

A non-volatile memory chip has 512 or more high-voltage latches like the typical high-voltage latch circuit 10, some or all of which may be leaky with a high voltage at their HV terminals. Excessive leakage currents taken from the on-chip high voltage generation circuit, such as, for example, an on-chip charge pump, that supplies a nominal 15 volts, may cause the voltage at the HV terminal 18 to be pulled down to, say, 12 volts. The reduced high voltage at the HV terminal 18 may cause malfunctions in a memory write function.

FIG. 2 is a timing diagram that illustrates operation of the typical high-voltage latch circuit 10 of FIG. 1, where offset voltage drops are ignored. A LOAD signal is initially applied at a low level to the gate terminal 30 of the load input NMOS transistor 26 to keep the load input NMOS transistor 26 off. When the LOAD signal is raised to Vdd, the load input NMOS transistor 26 is turned on to provide a logic level DATA IN signal to the latch input node A. After the LOAD signal goes high to the Vdd level, the voltage on the latch input node A is at a low level and the voltage on the data storage output node B goes to Vdd. Subsequently, a HV_ENABLE control signal goes high to apply the high voltage HV from a high voltage generation circuit to the HV node 18. The second pull-up PMOS transistor 22 is turned on so that the voltage at the data storage output node B is at essentially the same voltage as the HV node 18. The HV voltage at the HV node 18 is initially at a Vdd level 32. After the HV_ENABLE control voltage goes high to connect the high voltage generation circuit to the HV node 18, the HV voltage at node 18 rises as indicated by the segment 34 to a HV(Actual) level 36 that is less than the full HV(Target)

level 38 because of the leakage current that the high voltage generation circuit must provide to the leaky pull-down NMOS transistor 24. The full HV(Target) level 38 is, for example, 15 volts while the HV(Actual) level 36 is, for example, 12 volts due to leakage in various high voltage latch circuits.

Various possible remedies for reducing the effect of leakage through the pull-down NMOS transistor 24 have some disadvantages. Changing process parameters for fabrication of the pull-down NMOS transistor 24 may reduce leakage; but this can cause its threshold voltage Vt to increase and adversely affect low-voltage operation.

To decrease leakage current, the resistance of the pull-down NMOS transistor 24 can be increased by increasing the gate length L of the pull-down NMOS transistor; but this takes more area on the chip and increases the size of the chip. The current output, or strength, of the HV generation circuit can be increased; but this may require a larger pump circuit, which takes more area on the chip and increases the size of the chip. Increasing the strength of the HV generation circuit may also require a higher clock frequency to provide a greater write current.

SUMMARY OF THE INVENTION

The present invention provides a non-volatile memory having one or more high-voltage latches. Each high-voltage latch includes a first CMOS inverter that is connected between a HV terminal and a ground terminal and has an input terminal and an output terminal. Each high-voltage latch also includes a second CMOS inverter that is connected between the HV terminal and a switch node C and has an input terminal and an output terminal. The input terminal of the second CMOS inverter and the output terminal of the first CMOS inverter are connected to a latch input node A for the high voltage latch circuit. A DATA IN input terminal is connected to the latch input node A through a load input NMOS transistor, at a gate terminal of which is provided a DATA LOAD signal to turn on the load input NMOS transistor and load a data bit into the latch input node A. The input terminal of the first CMOS inverter and the output terminal of the second CMOS inverter are connected to a latch output node B.

The present invention also provides a switching circuit that is connected between all of the one or more switch nodes C of the one or more latches and the ground terminal. During an INPUT DATA LOAD mode of operation, the switching circuit provides a LOW impedance in series with the one or more second CMOS inverters when the HV terminal has a LOW voltage applied to it. During a HIGH-VOLTAGE WRITE mode of operation, the switching circuit provides a HIGH impedance in series with the one or more second CMOS inverters to limit leakage current caused by punch-through when the HV terminal has a HIGH voltage applied to it. During a standby mode of operation, the switching circuit provides a HIGH impedance in series with the second CMOS inverter when the HV terminal has a LOW voltage applied to it.

The second CMOS inverter includes a PMOS pull-up transistor and a high-voltage, low-threshold NMOS pull-down transistor. During a HIGH-VOLTAGE WRITE mode of operation, the HIGH impedance connected in series with the low-threshold NMOS pull-down transistor of the second CMOS inverter limits leakage current caused by punch-through when the HV terminal has a HIGH voltage applied to it.

In a first embodiment and a second embodiment of the invention, the impedance switching circuit includes a first NMOS switching transistor and a second NMOS switching transistor both connected in parallel between the switching node C and the ground terminal. During an INPUT DATA LOAD mode of operation, the first NMOS switching transistor is turned on and the second NMOS switching transistor is turned on to provide the LOW impedance in series with the second CMOS inverter when the HV terminal has a LOW voltage applied to it. During the HIGH-VOLTAGE WRITE mode of operation, the second NMOS switching transistor is turned off and the first NMOS switching transistor is turned on when the HV terminal has a HIGH voltage applied to it. During the HIGH-VOLTAGE WRITE mode of operation, the first NMOS switching transistor is minimally turned on by a LOW BIAS voltage that is sufficient to turn on the first NMOS switching transistor when the HV terminal has a HIGH voltage applied to it.

In a third embodiment of the invention, the switching circuit includes a third NMOS switching transistor that is connected between the impedance-switch node C and the ground terminal and that is turned on to provide a LOW impedance during an INPUT DATA LOAD mode of operation and that is minimally turned on during the HIGH-VOLTAGE WRITE mode of operation by a LOW BIAS voltage to provide a HIGH impedance when the HV terminal has a HIGH voltage applied to it. The LOW BIAS voltage is coupled to a band gap voltage source.

In the first embodiment of the invention, a standby input signal terminal is connected through an inverter to a gate terminal of the first NMOS transistor X1 and to one input terminal of a two-input NOR gate that has an output terminal connected to a gate terminal of the second MOS switching transistor. An HV ENABLE signal terminal is connected to the other input terminal of the two-input NOR gate.

In the second embodiment, a two-input NOR gate having an output terminal is connected to a gate terminal of the second MOS switching transistor. A HV ENABLE signal terminal is connected to one input terminal of the two-input NOR gate. A standby input signal terminal is connected to another input terminal of the two-input NOR gate. In this second embodiment, a two-input multiplexer is provided that has: an output terminal connected to a gate terminal of the first NMOS switching transistor; a control terminal connected to the HV ENABLE signal terminal; a zero input terminal connected through an inverter to the standby input signal terminal; and a one input terminal connected to a bias voltage input terminal at which is provided a LOW BIAS voltage.

In the third embodiment, a two-input multiplexer is provided that has: an output terminal connected to a gate terminal of the third NMOS switching transistor X10; a control terminal connected to the HV ENABLE signal terminal; a zero input terminal connected through an inverter to the standby input signal terminal; and a one input terminal connected to a bias voltage input terminal at which is provided a LOW BIAS voltage. In a further embodiment, the LOW BIAS voltage is coupled to a band gap voltage source.

The HIGH voltage applied during a HIGH Voltage WRITE mode of operation is provided by a charge pump circuit for the one or more latch circuits.

The present invention provides a method of limiting leakage current in one or more a high-voltage latches for high-voltage writing of data into a non-volatile memory. For each of the one or more latches, the method includes the steps of: connecting a cross-coupled CMOS latch between a HV terminal and a ground terminal by connecting a first CMOS inverter between a HV terminal and a ground terminal and by connecting a second CMOS inverter between the HV terminal and an impedance switch node; connecting an input terminal of the second CMOS inverter and an output terminal of the first CMOS inverter to a latch input node A for the latch circuit; connecting the latch input node A through a load input NMOS transistor to a DATA In input terminal of the latch; providing a LOAD signal at a gate terminal of the load input NMOS transistor to turn on the load input NMOS transistor; connecting an input terminal of the first CMOS inverter and an output terminal of the second CMOS inverter to a latch output node B for the latch circuit; connecting a switching circuit between the impedance-switch node C and the ground terminal; providing a LOW impedance in series with the second CMOS inverter when the HV terminal has a LOW voltage applied to it during an INPUT DATA LOAD mode of operation; and providing a HIGH impedance in series with the second CMOS inverter to prevent leakage current caused by punch-through when the HV terminal has a HIGH voltage applied to it during a HIGH-VOLTAGE WRITE mode of operation.

The method further includes the switching circuit providing a HIGH impedance in series with the second CMOS inverter when the HV terminal has a LOW voltage applied to it during a standby mode of operation. The method also includes: the second CMOS inverter having a PMOS pull-up transistor and a high-voltage, low-threshold NMOS pull-down transistor; and the HIGH impedance connected in series with the low-threshold NMOS pull-down transistor of the second CMOS inverter limiting leakage current caused by punch-through when the HV terminal has a HIGH voltage applied to it during a HIGH-VOLTAGE WRITE mode of operation.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Briefly, the invention provides a cross-coupled CMOS high-voltage latch for storing data bits to be written to non-volatile memory cells. During programming, or writing, of data bits into the memory cells, a high voltage is applied to the latch, which subjects an NMOS low-threshold pull-down transistor in the latch to the high voltage. In a programming mode of operation in order to limit leakage current in the NMOS transistor when it is subjected to a high programming voltage, a switching circuit provides a high impedance between the NMOS transistor and ground. During a read mode of operation, the switching circuit provides a low impedance between the NMOS transistor and ground.

Because a large number of latches are connected in parallel, their accumulated leakage currents would load a voltage generator, such as a charge pump circuit, to the point where it could not provide a high voltage great enough to properly write data into the non-volatile memory cells.

First Embodiment of the Invention

Figure 3:
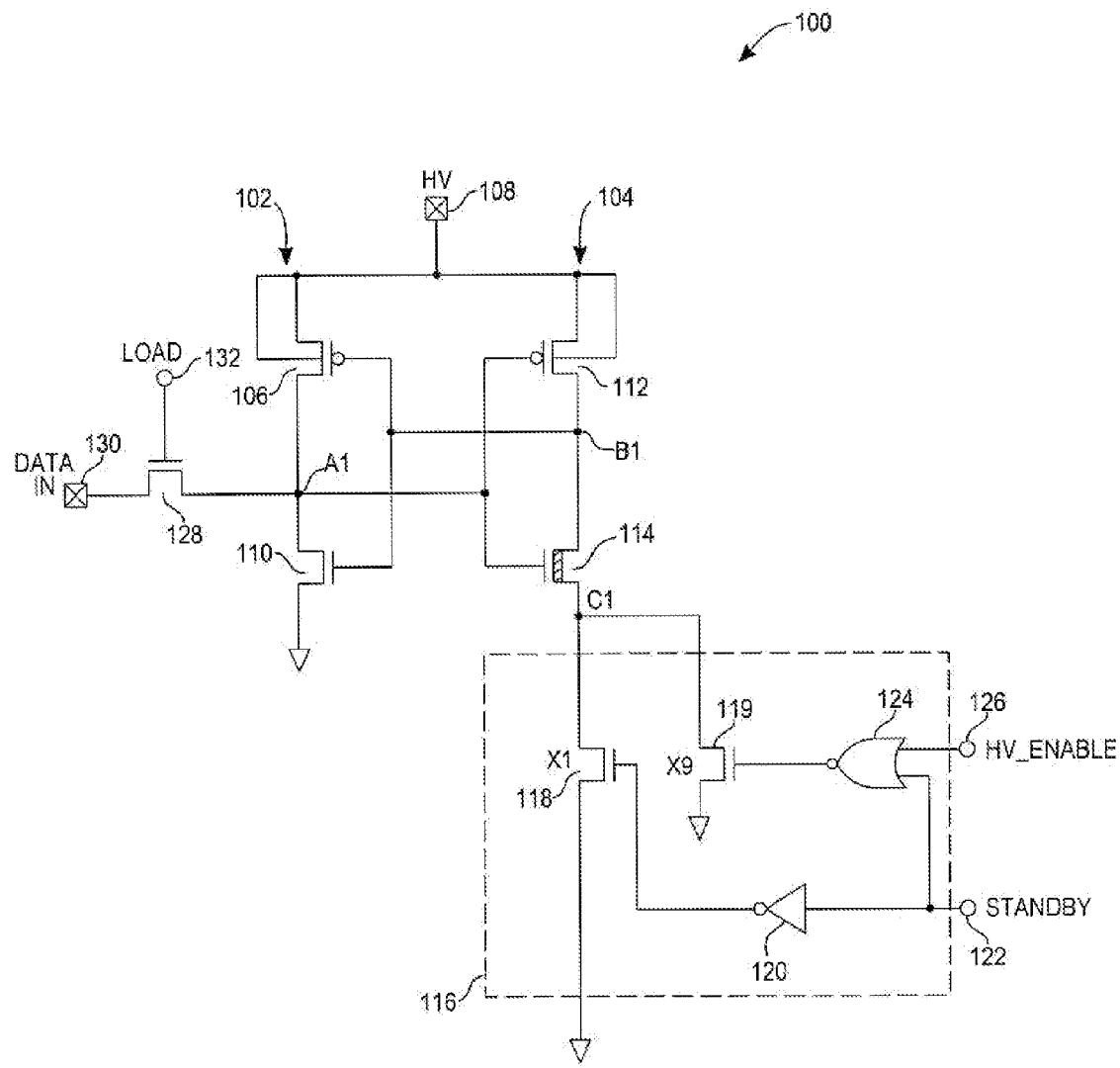
FIG. 3 is a circuit diagram of a first embodiment of a high voltage latch circuit

FIG. 3 is a circuit diagram of a first embodiment of a high voltage latch circuit 100 that includes a first CMOS inverter circuit 102 and a second CMOS inverter circuit 104. The first CMOS inverter circuit 102 includes a first pull-up PMOS transistor 106 that has a drain connected to a HV node 108 and a source connected to a latch input node A1. The first CMOS inverter circuit 102 also includes a first pull-down NMOS transistor 110 that has a drain connected to the latch input node A1 and a source connected to ground. The gates of the first pull-up PMOS transistor 106 and the first pull-down NMOS transistor 110 are connected together.

The second CMOS inverter circuit 104 includes a second pull-up PMOS transistor 112 that has a drain connected to the HV node 108 and a source connected to a data storage output node B1. The second CMOS inverter circuit 104 includes a second NMOS pull-down transistor 114 that has a drain connected to the data storage output node B1. The gates of the second pull-up PMOS transistor 112 and the second pull-down NMOS transistor 114 are connected together. The drain of the second pull-down NMOS transistor 114 is connected to a switch node C1. The switch node C1 is connected to ground through a switching circuit 116. A non-volatile memory has one or more high-voltage latches, typically up to 512 or more. The switching circuit 116 is connected between all of the one or more switch nodes C of the one or more latches and the ground terminal. During an INPUT DATA LOAD mode of operation, the switching circuit 116 provides a LOW impedance in series with the one or more second CMOS inverters when the HV terminal has a LOW voltage applied to it. During a HIGH-VOLTAGE WRITE mode of operation, the switching circuit 116 provides a HIGH impedance in series with the one or more second CMOS inverters to limit leakage current caused by punch-through when the HV terminal has a HIGH voltage applied to it. Because it is connected to a number of high-voltage latch circuits, the switch circuit 116 uses large transistors to handle the combined current for all of those high-voltage latch circuits. Large transistors are often divided into a number of smaller transistors that are called "fingers". The switching transistor or transistors that are in the switching circuit 116 can be considered as such fingers and are designated, for example, as X1, X9, X10, that represent the relative strength of that transistor with respect to current carrying capacity. Typically, X1 would have a relatively high channel impedance. X9 and X10 would have a relatively low channel impedance. A greater number has a relatively greater current capacity, a higher admittance or a lower impedance. As a specific example, compared to an X1 transistor, a X9 transistor has nine times the strength, or one-ninth of the impedance. A X1 and a X9 transistor can be operated in parallel to provide the equivalent of a X10 transistor. Note that the strength of a particular transistor can be controlled by applying a biasing voltage that minimally turns it on to a strength less than its nominal strength or a biasing voltage that turns it on to it full nominal strength.

While various embodiments of the various preferred embodiments of the present invention use X1, X9, X10 transistors, it is understood that various other transistor strengths can be used, depending upon the requirements of particular applications.

A source of the second NMOS pull-down transistor 114 is connected to the drains of an X1 NMOS transistor 118 and an X9 NMOS transistor 119. The sources of the X1 NMOS transistor 118 and the X9 NMOS transistor 119 are both connected to ground. A gate of the X1 NMOS transistor 118 is connected to an output of an inverter 120 that has its input connected to a STANDBY signal input terminal 122. A gate of the X9 NMOS transistor 119 is connected to an output terminal of a 2-input NOR gate 124. One input terminal of the 2-input NOR gate 124 is connected to the STANDBY signal input terminal 122. The other input terminal of the 2-input NOR gate 124 is connected to a HV ENABLE signal input terminal 126.

The latch input node A1 is connected through a load input NMOS transistor 128 to a DATA IN terminal 130. A LOAD signal is provided at a gate terminal 132 of the load input NMOS transistor 128 for loading a data bit into the latch circuit 100.

Figure 4:
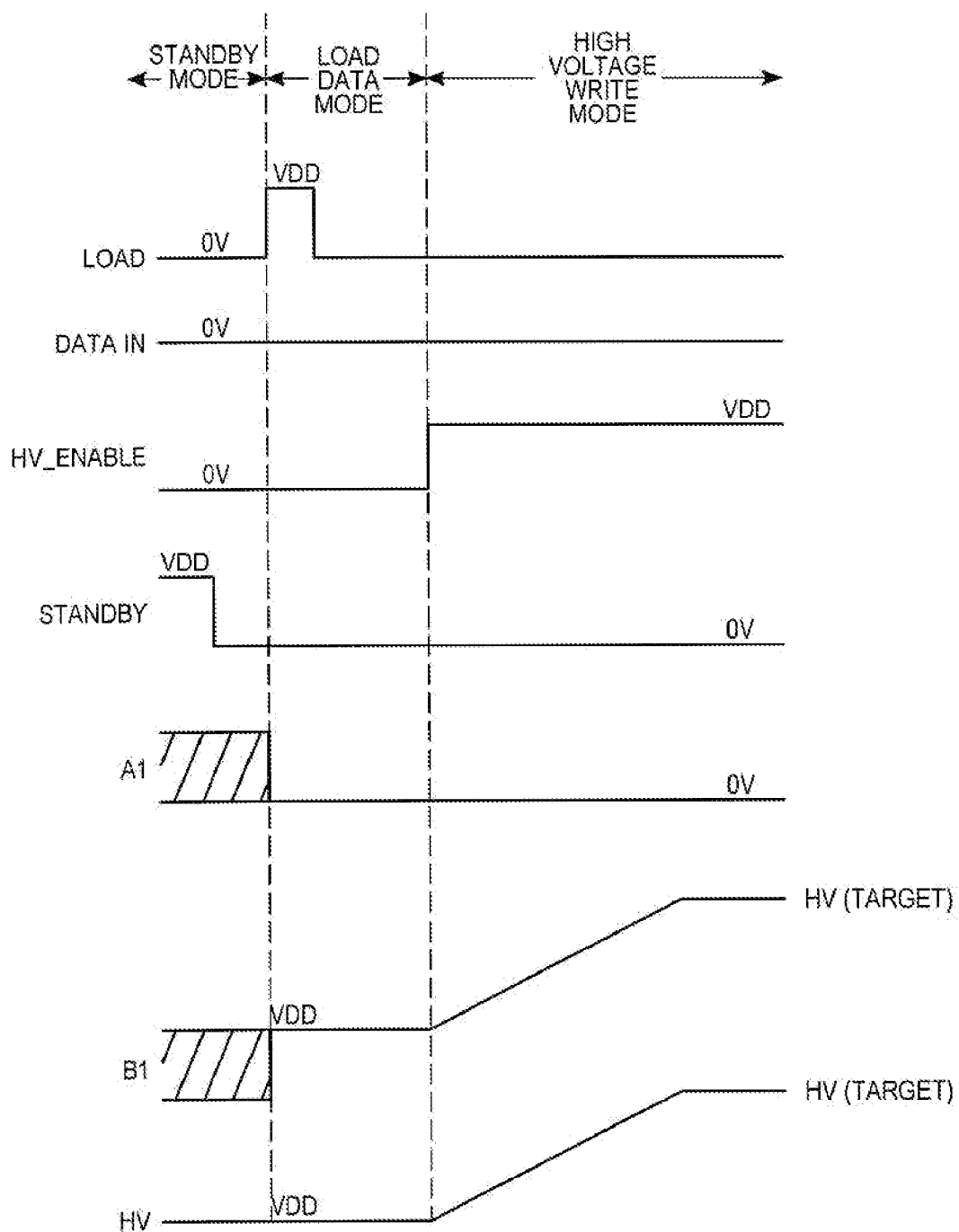
FIG. 4 is a timing diagram that is applicable to the circuits of FIGS. 3, 5, and 6.

FIG. 4 is a timing diagram that illustrates operation of the high-voltage latch circuit 100 of FIG. 3. The high-voltage latch circuit 100 operates in three modes: a standby mode; a data-loading mode; and a high-voltage write mode. The standby mode of operation occurs when the latch circuit 100 is powered by a low Vdd voltage on the HV node 108. The data-loading mode occurs when input data at DATA IN terminal 130 is loaded into the latch circuit 100 that still operates at the low Vdd voltage. The high-voltage write mode occurs when the high voltage is applied to the HV node 108 to write data into non-volatile memory cells.

Standby Mode

During the standby mode of operation, the STANDBY signal is at a VDD (HIGH) level and the HV ENABLE signal is at a 0 (LOW) level. Data at the latch input node A1 and the data storage output node B1 is either HIGH or LOW. The voltage level at the HV node 108 is VDD. A HIGH STANDBY signal at input terminal 122 is inverted in the inverter 120 to turn off the X1 NMOS transistor 118. A LOW HV ENABLE signal at input terminal 126 and a HIGH STANDBY signal at node 122 produces a LOW voltage level at the output of the 2-input NOR gate 124 to turn off the X9 NMOS transistor 119. In the standby mode of operation, both X1 and X9 are turned off.

Prior to the standby mode of operation ending, the STANDBY signal goes to a LOW signal level. A LOW voltage at STANDBY signal input terminal 122 causes a HIGH signal level at the gate terminal of the X1 NMOS transistor 118 to turn on the X1 NMOS transistor 118. Two LOW signal levels at the input terminals of the 2-input NOR gate 124 produces a HIGH voltage at the gate terminal of the X9 NMOS transistor 119 to turn on the X9 NMOS transistor 119. Note that the data at the latch input node A1 and the data storage output node B1 remains at their previous HIGH or LOW levels. When the X1 and X9 transistors are both turned on, they provide a low impedance path for the switch node C1 to ground. This allows the latch 100 to operate efficiently and with the high-voltage, low-threshold second NMOS transistor 114 to operate with limited punch-through leakage current being drawn from the high-voltage supply or generator.

Data-Loading Mode

The data-loading mode of operation begins when the LOAD signal at a VDD level is provided at the gate terminal 132 of the load input NMOS transistor 128. In this mode of operation, a LOW input signal at the DATA IN terminal 130 is loaded into the latch input node A1. This cause the data storage output node B1 to go to a HIGH VDD level, which turns on the second pull-up PMOS transistor 112 and which turns off the second pull-down NMOS transistor 114. When a HIGH input signal is at the DATA IN terminal 130, the data storage output node B1 goes to a LOW level caused by the second pull-down NMOS transistor being turned on.

High-Voltage Write Mode

During the high-voltage write mode of operation, the STANDBY voltage at input terminal 122 remains off at a LOW level and the HV ENABLE signal level at the input terminal 126 is at a HIGH level. The LOW STANDBY signal level at terminal 122 is inverted by the inverter 120 to cause a HIGH level of the gate of the X1 NMOS transistor 118 to turn on the X1 NMOS transistor 118. The 2-input NOR gate 124 is turned off by a HIGH HV ENABLE signal and a LOW STANDBY signal, which turns off the X9 NMOS transistor 119. In this mode of operation leakage current is limited by the high impedance of X1.

At this time, a high voltage supply is applied to the HV node 108 and the voltage at the data storage output node B1 follows the voltage on the HV node 108. FIG. 4 shows these two voltages HV and B1 ramping up to the HV voltage target level, for example, of 15 volts.

In the high-voltage write mode of operation when a high voltage generation circuit provides a high voltage at the HV node 108, the X1 NMOS transistor 118 is turned on and the X9 NMOS transistor 119 is turned off to limit current flowing through the second pull-down NMOS transistor 114. As a result, leakage current is reduced and the output voltage of the HV generation is not pulled down by leakage current from all of 512 HV latch circuits in a non-volatile memory chip.

Second Embodiment of the Invention

Figure 5:
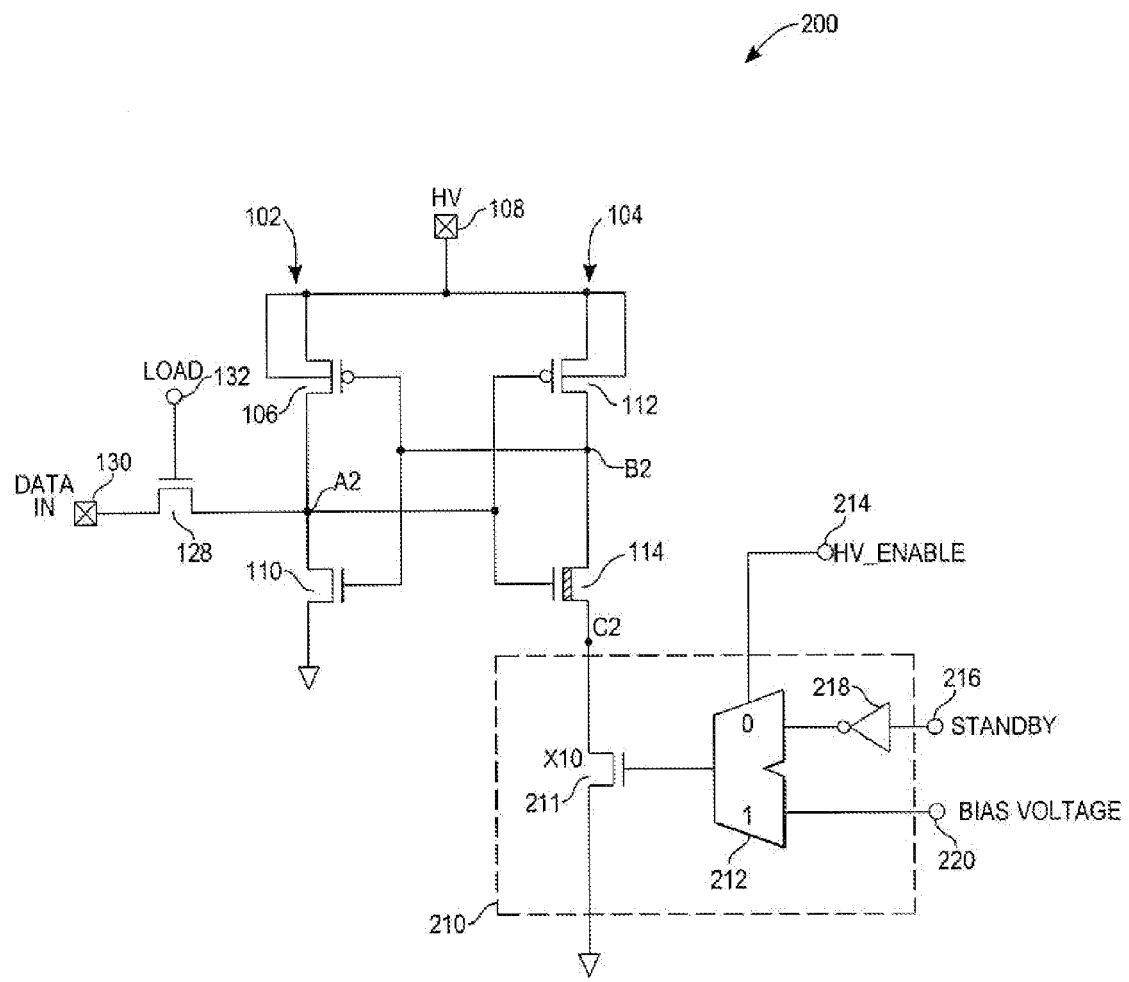
FIG. 5 is a circuit diagram of a second embodiment of a high voltage latch circuit

FIG. 5 is a circuit diagram of a second embodiment of a high voltage latch circuit 200, where components similar to those of FIG. 3 have the same reference characters, such as the first CMOS inverter circuit 102 and the second CMOS inverter circuit 104. The first CMOS inverter circuit 102 includes the first pull-up PMOS transistor 106 that has a drain connected to the HV node 108 and a source connected to a latch input node A2. The first CMOS inverter circuit 102 also includes the first pull-down NMOS transistor 110 that has a drain connected to the latch input node A2 and a source connected to ground. The gates of the first pull-up PMOS transistor 106 and the pull-down NMOS transistor 110 are connected together.

The second CMOS inverter circuit 104 includes a second pull-up PMOS transistor 112 that has a drain connected to the HV node 108 and a source connected to a data storage output node B2. The second CMOS inverter circuit 104 includes a second pull-down NMOS transistor 114 that has a drain connected to the data storage output node B2. The gates of the second pull-up PMOS transistor 112 and the second pull-down NMOS transistor 114 are connected together.

A source of the second pull-down NMOS transistor 114 is connected to a switch node C2 and through a switching circuit 210 to ground. The switch node C2 is connected to a drain of a X10 NMOS transistor 211 that has its source connected to ground. A gate of the X10 NMOS transistor 211 is connected to an output terminal of a 2-input multiplexer 212, which is controlled by a HV ENABLE control signal that is provided to a multiplexer control terminal 214. A STANDBY signal is provided to a terminal 216 and inverted by an inverter 218. The inverted STANDBY signal is applied to a 0 input terminal of the 2-input multiplexer 212. A bias voltage from a source of intermediate voltage, such as, for example, a bandgap circuit is applied to a 1 input terminal of the 2-input multiplexer 212. The intermediate voltage is high enough to turn on the X10 NMOS transistor 211 but low enough to limit the current flow through the X10 NMOS transistor 211.

The timing diagram of FIG. 4 also applies to FIG. 5 to illustrate operation of the high-voltage latch circuit 200 of FIG. 5. The high-voltage latch circuit 200 also operates in three modes: a standby mode; a data-loading mode; and a high-voltage write mode. The standby mode of operation occurs when the latch circuit 200 is powered by a low Vdd voltage on the HV node 108. The data-loading mode occurs when input data at DATA IN terminal 130 is loaded into the latch circuit 200 that still operates at the low Vdd voltage. The high-voltage write mode occurs when the high voltage is applied to the HV node 108 to write data into non-volatile memory cells.

Standby Mode

During the standby mode of operation, the STANDBY signal at terminal 216 is at a VDD (HIGH) level and the multiplexer control HV ENABLE signal at terminal 214 is at a 0 (LOW) level. Data at the latch input node A1 and the data storage output node B1 is either HIGH or LOW. The voltage level at the HV node 108 is VDD. A HIGH STANDBY signal at input terminal 122 is inverted in the inverter 218 to turn off the X10 NMOS transistor 211. When the STANDBY signal at terminal 216 goes to a LOW level and the HV ENABLE signal at terminal 214 is still LOW, the inverter 218 provides a HIGH signal level through the multiplexer 212 to turn on X10 NMOS transistor 211.

Data-Loading Mode

The data-loading mode of operation begins when the LOAD signal at a VDD level is provided at the gate terminal 132 of the load input NMOS transistor 128. In this mode of operation, a LOW input signal at the DATA IN terminal 130 is loaded into the latch input node A2. This cause the data storage output node B2 to go to a HIGH VDD level, which turns on the second pull-up PMOS transistor 112 and which turns off the second pull-down NMOS transistor 114.

High-Voltage Write Mode

During the high-voltage write mode of operation, the HV ENABLE signal level at the input terminal 126 of the multiplexer 212 is at a HIGH level, which selects the bias voltage at terminal 220 to be applied to the gate of the X10 NMOS transistor 211. The bias voltage is provided from, for example, from a bandgap circuit, at an intermediate voltage level. The intermediate voltage level is high enough to minimally turn on the X10 NMOS transistor 211, but low enough to limit the current flowing through the X10 NMOS transistor 211. In this mode of operation leakage current is limited by the X10 NMOS transistor being in a relatively high impedance state.

At this time, a high voltage supply is applied to the HV node 108 and the voltage at the data storage output node B2 follows the voltage on the HV node 108. FIG. 4 shows these two voltages ramp up to the HV voltage target level, for example, of 15 volts.

As a result, leakage current is reduced and the output voltage of the HV generation is not pulled down by leakage current from all of 512 HV latch circuits in a non-volatile memory chip.

Figure 1:
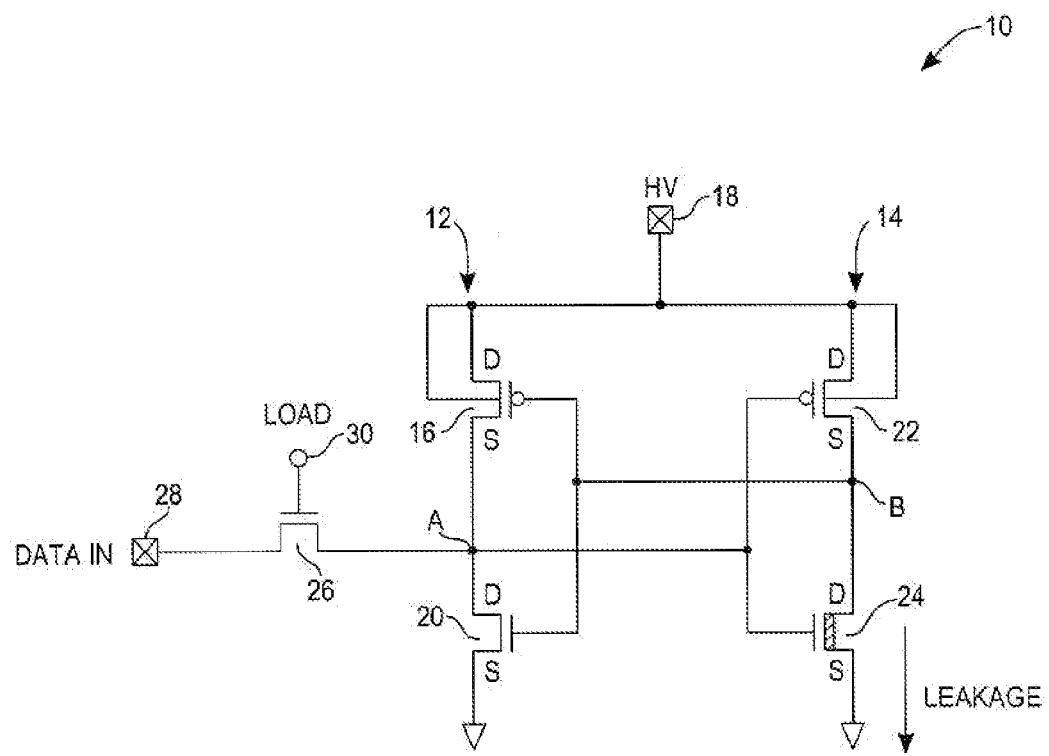
FIG. 1 is a circuit diagram of a prior art high voltage latch circuit having a leakage path from an output terminal to ground.
Figure 2:
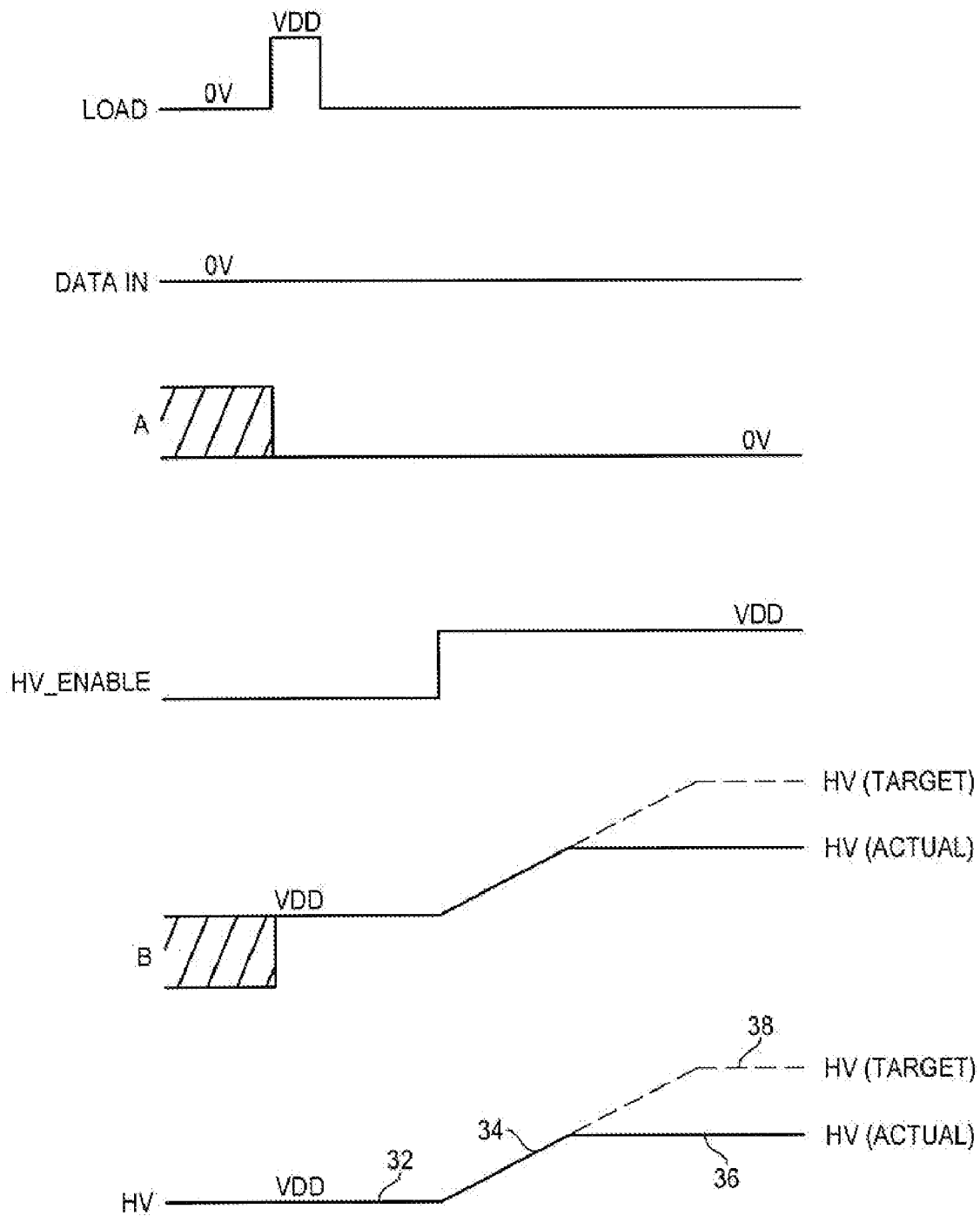
FIG. 2 is a timing diagram for the circuit of FIG. 1.

As mentioned previously in connection with FIG. 1, when the non-volatile chip is not being used in a high-voltage write mode of operation, a Vdd logic-circuit power supply voltage of 3 volts, for example, is provided to the HV node 108 to power the two inverters 102, 104 forming a high-voltage latch. When the non-volatile chip is actually being used in a high-voltage write mode of operation, a high-voltage power supply of 15 volts, for example, is provided to the HV node 108. The high-voltage is supplied from a high-voltage generation circuit, such as, for example, a charge-pump circuit that is provided on the chip.

Third Embodiment of the Invention

Figure 6:
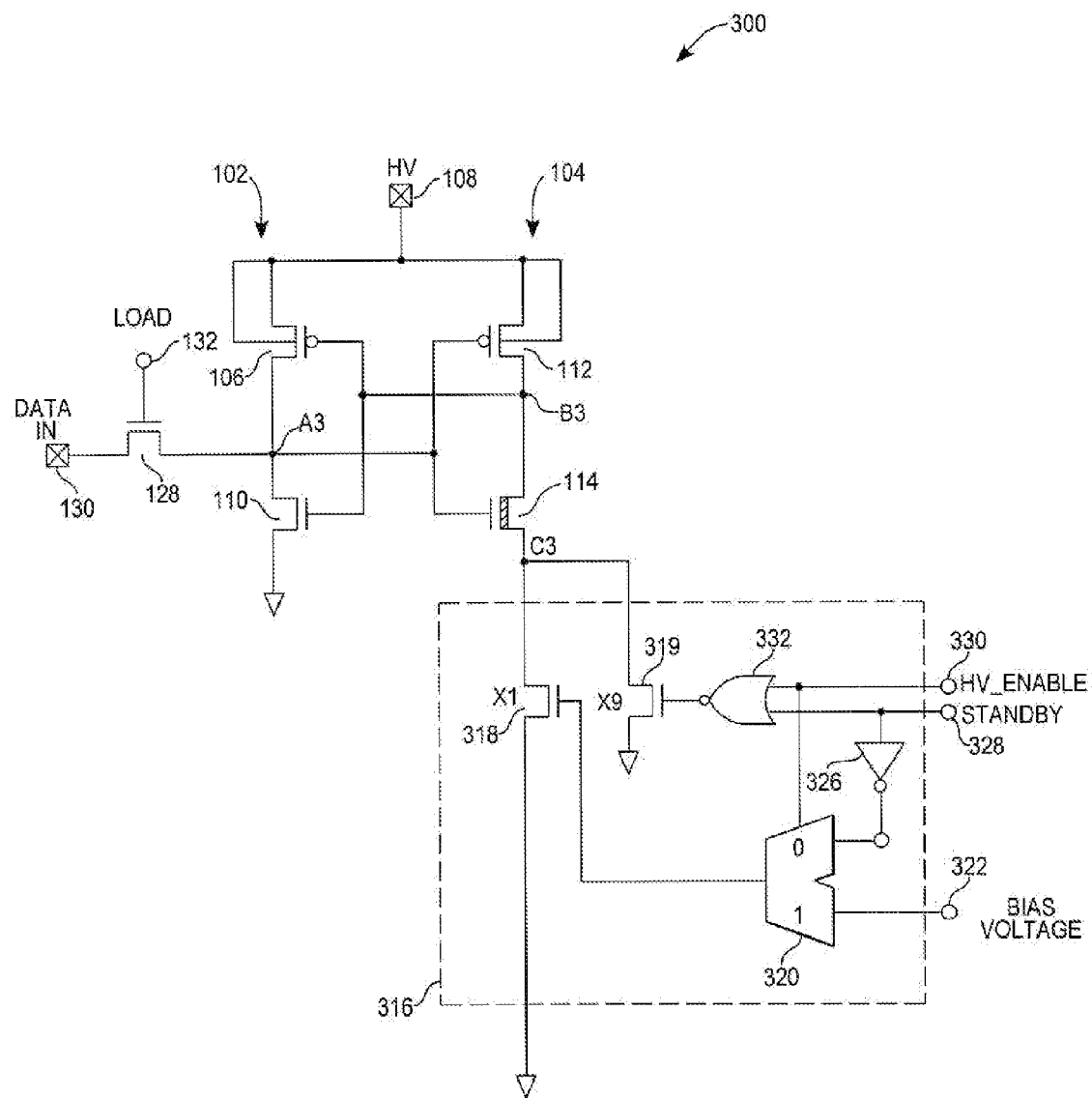
FIG. 6 is a circuit diagram of a third embodiment of a high voltage latch circuit

FIG. 6 is a circuit diagram of a third embodiment of a high voltage latch circuit 300, where similar components have the same reference characters, such as the first CMOS inverter circuit 102 and the second CMOS inverter circuit 104. The first CMOS inverter circuit 102 includes a first pull-up PMOS transistor 106 that has a drain connected to a HV node 108 and a source connected to a latch input node A3. The first CMOS inverter circuit 102 also includes a first pull-down NMOS transistor 110 that has a drain connected to the latch input node A3 and a source connected to ground. The gates of the first pull-up PMOS transistor 106 and the first pull-down NMOS transistor 110 are connected together.

The second CMOS inverter circuit 104 includes a second pull-up PMOS transistor 112 that has a drain connected to the HV node 108 and a source connected to a data storage output node B3. The second CMOS inverter circuit 104 includes a second pull-down NMOS transistor 114 that has a drain connected to the data storage output node B3. The gates of the second pull-up PMOS transistor 112 and the second pull-down NMOS transistor 114 are connected together.

The latch input node A3 is connected through a load input NMOS transistor 128 to a DATA IN terminal 130. A LOAD signal is provided at a gate terminal 132 of the load input NMOS transistor 128.

A source of the second pull-down NMOS transistor 114 is connected to the switch node C3 and through a switching circuit 316 to ground. The switch node C3 is connected to the drains of an X1 NMOS transistor 318 and an X9 NMOS transistor 319. The sources of the X1 NMOS transistor 318 and the X9 NMOS transistor 319 are both connected to ground.

A gate of the X1 NMOS transistor 318 is connected to an output of a multiplexer 320 that has its "1" input terminal 322 connected to a BIAS VOLTAGE.

A "0" input terminal of the multiplexer 320 is connected through an inverter 326 to a STANDBY input terminal 328.

A control signal for the 2-input multiplexer 320 is provided from a HV ENABLE signal terminal 330.

A gate terminal of the X9 NMOS transistor 319 is connected to an output terminal of a 2-input NOR gate 332. One input terminal of the 2-input NOR gate 332 is connected to the STANDBY signal input terminal 328. The other input terminal of the 2-input NOR gate 332 is connected to the HV ENABLE signal input terminal 330.

The latch input node A3 is connected through a load input NMOS transistor 128 to a DATA IN terminal 130. A LOAD signal is provided at a gate terminal 132 of the load input NMOS transistor 128.

The timing diagram of FIG. 4 also applies to FIG. 6 to illustrate operation of the high-voltage latch circuit 300 of FIG. 5. The high-voltage latch circuit 300 also operates in three modes: a standby mode; a data-loading mode; and a high-voltage write mode. The standby mode of operation occurs when the latch circuit 300 is powered by a low Vdd voltage on the HV node 108. The data-loading mode occurs when input data at DATA IN terminal 130 is loaded into the latch circuit 300 that still operates at the low Vdd voltage.

The high-voltage write mode occurs when the high voltage is applied to the HV node 108 to write data into non-volatile memory cells.

Standby Mode

During the standby mode of operation, the STANDBY signal is at a VDD (HIGH) level and the HV ENABLE signal is at a 0 (LOW) level. This provides a LOW signal at the output terminal of the 2-input NOR gate 332 to turn off X9 NMOS transistor 319.

The LOW HV ENABLE controls the 2-input multiplexer to select input signals at the "0" input terminal of the multiplexer 320. The HIGH level of the STANDBY signal produces a LOW signal at the "0" input terminal 324 and through the 2-input multiplexer to the gate of the X1 NMOS transistor 318.

In the standby mode of operation, both X1 and X9 are turned off.

Immediately prior to the standby mode of operation being exited, the STANDBY signal goes to a LOW signal level. A LOW voltage at terminal 328 and a LOW voltage at terminal 330 causes the 2-input NOR gage 332 to produce a HIGH signal level at the gate terminal of the X9 NMOS transistor 319 that turns on the X9 NMOS transistor 319.

Data-Loading Mode

The data-loading mode of operation begins when the LOAD signal goes to a VDD level. A LOW IN signal produces a LOW level at terminal A3 and a VDD HIGH signal at terminal B3. In this mode, a LOW input signal at the DATA IN terminal 130 is loaded into the latch input node A3. This cause the data storage output node B3 to go to a HIGH VDD level, which turns on the second pull-up PMOS transistor 112 and which turns off the second pull-down NMOS transistor 114.

High-Voltage Write Mode

During the high-voltage write mode of operation, the STANDBY voltage at input terminal 328 is at a LOW level and the HV ENABLE signal level at the input terminal 330 is at a HIGH level. This produces a LOW signal level at the output terminal of the 2-input NOR gate 332 to turn off the X9 NMOS transistor 319.

A HIGH HV ENABLE signal at input terminal 330 controls the 2-input multiplexer 320 to select its "1" input terminal 322 that is connected to a bias that is provided from, for example, from a bandgap circuit, at an intermediate voltage level. The intermediate level is high enough to minimally turn on the X1 NMOS transistor 318, but low enough to limit the current flowing through the X1 NMOS transistor 318.

In this mode of operation leakage current is limited by the high impedance of X1 NMOS transistor 318.

At this time, a high voltage supply is applied to the HV node 108 and the voltage at the data storage output node B3 follows the voltage on the HV node 108. FIG. 4 shows these two voltages ramp up to the HV voltage target level, for example, of 15 volts.

In the high-voltage write mode of operation when a high voltage generation circuit provides a high voltage at the HV node 108, the X1 NMOS transistor 318 is turned on and the X9 NMOS transistor 319 is turned off to limit current flowing through the second pull-down NMOS transistor 114. As a result, leakage current is reduced and the output voltage of the HV generation is not pulled down by leakage current from all of 512 HV latch circuits in a non-volatile memory chip.

A non-volatile memory according to the present invention has a number of high-voltage latches that have three modes of operation, including: a standby mode of operation, a data loading operation, and a high-voltage write mode of operation. Each high-voltage latch has a HV terminal, a ground terminal, a DATA IN input terminal, a latch input node A, and a latch output node B. Each high-voltage latch also includes a switch node C that is connected through a switching circuit to one leg of a cross-coupled CMOS inverter and to ground. During a writing mode of operation, the switching circuit provides a high-impedance to limit leakage current through that leg of the cross-coupled CMOS inverter caused by the high voltage across the latch.

The foregoing descriptions of specific embodiments of the present invention has been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A non-volatile memory having one or more high-voltage CMOS latches, each high-voltage CMOS latch comprising:

a first CMOS inverter connected between a HV terminal and a ground terminal and having an input terminal and an output terminal;

a second CMOS inverter connected between the HV terminal and a switch node C and having an input terminal and an output terminal;

the input terminal of the second CMOS inverter and the output terminal of the first CMOS inverter are connected to a latch input node A for the high voltage latch circuit;

a DATA IN input terminal connected to the latch input node A through a NMOS load input NMOS transistor, at a gate terminal of which is provided a DATA LOAD signal to turn on the NMOS load input NMOS transistor;

the input terminal of the first CMOS inverter and the output terminal of the second CMOS output terminal are connected to a latch output node B;

a switching circuit that is connected between all of the one or more switch nodes C of the one or more latches and the ground terminals;

during an INPUT DATA LOAD mode of operation, the switching circuit provides a LOW impedance in series with the one or more second CMOS inverters when the HV terminal has a LOW voltage applied to it; and during a HIGH-VOLTAGE WRITE mode of operation, the switching circuit provides a HIGH impedance in series with the one or more second CMOS inverters to limit leakage current caused by punch-through when the HV terminal has a HIGH voltage applied to it.

2. The non-volatile memory latch circuit of claim 1 wherein, during a standby mode of operation, the switching circuit provides a HIGH impedance in series with the second CMOS inverter when the HV terminal has a LOW voltage applied to it.

3. The non-volatile memory of claim 1 wherein, during a HIGH-VOLTAGE WRITE mode of operation, the second CMOS inverter includes a PMOS pull-up transistor and a high-voltage, low-threshold NMOS pull-down transistor; and wherein the HIGH impedance connected in series with the low-threshold NMOS pull-down transistor of the second CMOS inverter limits leakage current caused by punch-through when the HV terminal has a HIGH voltage applied to it.

4. The non-volatile memory of claim 3 wherein the impedance switching circuit includes a first NMOS switching transistor having a relatively high channel impedance and a second NMOS switching transistor having a relatively low channel impedance, both connected in parallel between the switch node C and the ground terminal.

5. The non-volatile memory of claim 4 wherein the first NMOS switching transistor is turned on and the second NMOS switching transistor is turned on to provide the LOW impedance in series with the second CMOS inverter when the HV terminal has a LOW voltage applied to it during an INPUT DATA LOAD mode of operation.

6. The non-volatile memory of claim 4 wherein the second NMOS switching transistor is turned off and the first NMOS transistor X1 is turned on when the HV terminal has a HIGH voltage applied to it during the HIGH-VOLTAGE WRITE mode of operation to limit leakage current from the low-threshold NMOS pull-down transistor of the second CMOS inverter.

7. The non-volatile memory of claim 6 wherein the first NMOS transistor X1 is minimally turned on by a voltage that is sufficient to turn on the first NMOS switching transistor when the HV terminal has a HIGH voltage applied to it during the HIGH-VOLTAGE WRITE mode of operation.

8. The non-volatile memory of claim 4 including:
a standby input signal terminal connected through an inverter to a gate terminal of the first NMOS transistor X1 and to one input terminal of a two-input NOR gate that has an output terminal connected to a gate terminal of the second MOS switching translator;
a HV-Enable signal terminal connected to the other input terminal of the two-input NOR gate.

9. The non-volatile memory of claim 4 including: a two-input NOR gate having an output terminal connected to a gate terminal of the second MOS switching transistor;
a HV-Enable signal terminal connected to one input terminal of the two-input NOR gate;
a standby input signal terminal connected to another input terminal of the two-input NOR gate;
a two-input multiplexer having:
an output terminal connected to a gate terminal of the first NMOS switching transistor;
a control terminal connected to the HV-Enable signal terminal;
a zero input terminal connected through an inverter to the standby input signal terminal; and
a one input terminal connected to a bias voltage input terminal at which is provided a LOW BIAS voltage.

10. The non-volatile memory of claim 3 wherein the switching circuit includes a third NMOS switching transistor that is connected between the switch node C and the ground terminal and that is turned on to provide a LOW impedance during an INPUT DATA LOAD mode of operation and that is minimally turned on during the HIGH-VOLTAGE WRITE mode of operation by a LOW BIAS voltage to provide a HIGH channel impedance when the HV terminal has a HIGH voltage applied to it.

11. The non-volatile memory of claim 10 wherein the LOW BIAS voltage is coupled to a band gap voltage source.

12. The non-volatile memory of claim 10 including a two-input multiplexer having:
an output terminal connected to a gate terminal of the third NMOS switching transistor;
a control terminal connected to the HV-Enable signal terminal;
a zero input terminal connected through an inverter to the standby input signal terminal; and
a one input terminal connected to a bias voltage input terminal at which is provided a LOW BIAS voltage.

13. The non-volatile memory of claim 12 wherein the LOW BIAS voltage is coupled to a band gap voltage source.

14. The non-volatile memory of claim 3 wherein the HIGH voltage applied during a HIGH Voltage WRITE mode of operation is provided by a charge pump circuit for the one or more latch circuits.

15. A non-volatile memory having one or more latches, each latch comprising:
a first CMOS inverter connected between a HV terminal and a ground terminal and having an input terminal and an output terminal;
a second CMOS inverter connected between the HV terminal and a switch node C and having an input terminal and an output terminal;
the input terminal of the second CMOS inverter and the output terminal of the first CMOS inverter are connected to a latch input node A for the high voltage latch circuit;
a DATA In input terminal connected to the latch input node A through a NMOS load input NMOS transistor, at a gate terminal of which is provided a DATA LOAD signal to turn on the NMOS load input NMOS transistor;
the input terminal of the first CMOS inverter and the output terminal of the second CMOS output terminal are connected to a latch output node B;
a switching circuit that is connected between all of the one or more switch nodes C of the one or more latches and the ground terminal;
the switching circuit provides a LOW impedance in series with the one or more second CMOS inverters when the HV terminal has a LOW voltage applied to it during an INPUT DATA LOAD mode of operation; and
the impedance switching circuit provides a HIGH impedance in series with the one or more second CMOS inverters to limit leakage current caused by punch-through when the HV terminal has a HIGH voltage applied to it during a HIGH-VOLTAGE WRITE mode of operation;
wherein the switching circuit provides a HIGH impedance in series with the second CMOS inverter when the HV terminal has a LOW voltage applied to it during a standby mode of operation; and
wherein the second CMOS inverter includes a PMOS pull-up transistor and a high-voltage, low-threshold NMOS pull-down transistor; and wherein the HIGH impedance connected in series with the low-threshold NMOS pull-down transistor of the second CMOS inverter limits leakage current caused by punch-through when the HV terminal has a HIGH voltage applied to it during a HIGH-VOLTAGE WRITE mode of operation.

16. The non-volatile memory of claim 15, wherein: the impedance switching circuit includes a first NMOS switching transistor having a relatively high channel impedance and a second NMOS switching transistor having a relatively low channel impedance, both connected in parallel between the switch node C and the ground terminal;

the first NMOS switching transistor is turned on and the second NMOS switching transistor is turned on to provide the LOW impedance in series with the second CMOS inverter when the HV terminal has a LOW voltage applied to it during an INPUT DATA LOAD mode of operation; and the second NMOS switching transistor is turned off and the first NMOS switching transistor is turned on when the HV terminal has a HIGH voltage applied to it during the HIGH-VOLTAGE WRITE mode of operation.

17. The non-volatile memory of claim 16 wherein the first NMOS switching transistor is minimally turned on by a LOW BIAS voltage that is sufficient to turn on the first NMOS switching transistor when the HV terminal has a HIGH voltage applied to it during the HIGH-VOLTAGE WRITE mode of operation.

18. The non-volatile memory of claim 15 wherein the switching circuit includes a third NMOS switching transistor that has a relatively low channel impedance and that is connected between the impedance-switch node C and the ground terminal and that is turned on to provide a LOW impedance during an INPUT DATA LOAD mode of operation and that is BARELY turned on during the HIGH-VOLTAGE WRITE mode of operation by a LOW BIAS voltage to provide a HIGH impedance when the HV terminal has a HIGH voltage applied to it.

19. A method of limiting leakage current in one or more high-voltage latches that are used for high-voltage writing of data into a non-volatile memory, comprising the steps for each of the one or more latches of:

connecting a cross-coupled CMOS latch between a HV terminal and a ground terminal by connecting a first CMOS inverter between a HV terminal and a ground terminal and by connecting a second CMOS inverter between the HV terminal and an impedance switch node;

connecting an input terminal of the second CMOS inverter and an output terminal of the first CMOS to a latch input node A for the latch circuit;

connecting the latch input node A through a NMOS load input NMOS transistor to a DATA In input terminal of the latch;

providing a LOAD signal at a gate terminal of the NMOS load input NMOS transistor to turn on the NMOS load input NMOS transistor;

connecting an input terminal of the first CMOS inverter and an output terminal of the second CMOS output terminal to a latch output node B for the latch circuit;

connecting a switching circuit between the impedance-switch node C and the ground terminal;

providing with the switching circuit a LOW impedance in series with the second CMOS inverter when the HV terminal has a LOW voltage applied to during an INPUT DATA LOAD mode of operation; and providing with the switching circuit a HIGH impedance in series with the second CMOS inverter to prevent leakage current caused by punch-through when the HV terminal has a HIGH voltage applied to it during a HIGH-VOLTAGE WRITE mode of operation.

20. The method of claim 19 including the switching circuit providing a HIGH impedance in series with the second CMOS inverter when the HV terminal has a LOW voltage applied to it during a standby mode of operation.

21. The method of claim 19 including:

the second CMOS inverter having a PMOS pull-up transistor and a high-voltage, low-threshold NMOS pull-down transistor; and the HIGH impedance connected in series with the low-threshold NMOS pull-down transistor of the second CMOS inverter limiting leakage current caused by punch-through of the high-voltage, low-threshold NMOS pull-down transistor when the HV terminal has a HIGH voltage applied to it during a HIGH-VOLTAGE WRITE mode of operation.

* * * * *

UNITED STATES PATENT AND TRADEMARK OFFICE
CERTIFICATE OF CORRECTION

PATENT NO. : 7,369,446 B2
APPLICATION NO. : 11/457377
DATED : May 6, 2008
INVENTOR(S) : Chan et al.

It is certified that error appears in the above-identified patent and that said Letters Patent is hereby corrected as shown below:

In column 2, line 2, delete "DATA In" and insert -- DATA IN --, therefor.

In column 4, line 34, delete "HV ENABLE" and insert -- HV_ENABLE --, therefor.

In column 4, line 38, delete "HV ENABLE" and insert -- HV_ENABLE --, therefor.

In column 4, line 45, delete "HV ENABLE" and insert -- HV_ENABLE --, therefor.

In column 4, line 53, delete "HV ENABLE" and insert -- HV_ENABLE --, therefor.

In column 5, line 46, after "circuit" insert -- . --.

In column 5, line 50, after "circuit" insert -- . --.

In column 5, line 52, after "circuit" insert -- . --.

In column 7, line 12, delete "HV ENABLE" and insert -- HV_ENABLE --, therefor.

In column 7, line 33, delete "HV ENABLE" and insert -- HV_ENABLE --, therefor.

In column 7, line 38, delete "HV ENABLE" and insert -- HV_ENABLE --, therefor.

In column 8, line 9, delete "HV ENABLE" and insert -- HV_ENABLE --, therefor.

In column 8, line 12, after "level" delete "of" and insert -- at --, therefor.

In column 8, line 14, delete "HV ENABLE" and insert -- HV_ENABLE --, therefor.

In column 8, line 62, delete "HV ENABLE" and insert -- HV_ENABLE --, therefor.

In column 9, line 21, delete "HV ENABLE" and insert -- HV_ENABLE --, therefor.

In column 9, line 28, delete "HV ENABLE" and insert -- HV_ENABLE --, therefor.

In column 9, lines 43-44, delete "HV ENABLE" and insert -- HV_ENABLE --, therefor.

In column 10, line 48, delete "HV ENABLE" and insert -- HV_ENABLE --, therefor.

In column 10, lines 53-54, delete "HV ENABLE" and insert -- HV_ENABLE --, therefor.

UNITED STATES PATENT AND TRADEMARK OFFICE
CERTIFICATE OF CORRECTION

PATENT NO. : 7,369,446 B2
APPLICATION NO. : 11/457377
DATED : May 6, 2008
INVENTOR(S) : Chan et al.

It is certified that error appears in the above-identified patent and that said Letters Patent is hereby corrected as shown below:

In column 10, line 61, delete "FIG. 5." and insert -- FIG. 6. --, therefor.

In column 11, line 7, delete "HV ENABLE" and insert -- HV_ENABLE --, therefor.

In column 11, line 11, delete "HV ENABLE" and insert -- HV_ENABLE --, therefor.

In column 11, line 22, delete "gage" and insert -- gate --, therefor.

In column 11, line 39, delete "HV ENABLE" and insert -- HV_ENABLE --, therefor.

In column 11, line 43, delete "HV ENABLE" and insert -- HV_ENABLE --, therefor.

In column 12, line 12, delete "through" and insert -- though --, therefor.

In column 13, line 38, in Claim 8, delete "translator" and insert -- transistor --, therefor.

Signed and Sealed this

Seventh Day of October, 2008

JON W. DUDAS
*Director of the United States Patent and Trademark Office*